US008395406B2

(12) United States Patent
Iwashita et al.

(10) Patent No.: US 8,395,406 B2
(45) Date of Patent: Mar. 12, 2013

(54) INTEGRATED CIRCUIT ARCHITECTURE FOR TESTING VARIABLE DELAY CIRCUIT

(75) Inventors: Tooru Iwashita, Kanagawa (JP);
Masahiko Shihara, Kanagawa (JP);
Atsushi Tangoda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 600 days.

(21) Appl. No.: 12/461,853

(22) Filed: Aug. 26, 2009

(65) Prior Publication Data
US 2010/0052698 A1     Mar. 4, 2010

(30) Foreign Application Priority Data

Aug. 28, 2008   (JP) ................ 2008-220171

(51) Int. Cl.
  *G01R 31/26*    (2006.01)
  *G01R 31/3187*  (2006.01)
  *H03L 7/06*     (2006.01)

(52) U.S. Cl. ............ 324/762.03; 324/750.3; 327/158
(58) Field of Classification Search ........... 324/762.01–762.09, 750.3; 327/158
See application file for complete search history.

(56) References Cited

U.S. PATENT DOCUMENTS

| 5,570,294 | A  | * | 10/1996 | McMinn et al. ............. 702/118 |
| 6,469,557 | B2 | * | 10/2002 | Hirabayashi ................ 327/263 |
| 7,035,148 | B2 |   | 4/2006  | Chung et al. |
| 7,394,277 | B2 | * | 7/2008  | Ishida et al. ............ 324/762.01 |
| 7,558,692 | B2 | * | 7/2009  | Suda et al. .................. 702/107 |
| 2003/0028835 | A1 | * | 2/2003 | Ishikawa .................. 714/718 |
| 2005/0146342 | A1 | * | 7/2005 | Jang et al. ................. 324/755 |
| 2007/0241767 | A1 | * | 10/2007 | Tsukishiro ................ 324/765 |
| 2008/0001661 | A1 | * | 1/2008 | Tachibana et al. ........... 330/253 |
| 2008/0129325 | A1 | * | 6/2008 | Ferraiolo et al. ........... 324/765 |

FOREIGN PATENT DOCUMENTS

JP      2004-139718      5/2004

\* cited by examiner

*Primary Examiner* — Joshua Benitez Rosario
(74) *Attorney, Agent, or Firm* — McGinn IP Law Group, PLLC

(57) ABSTRACT

An integrated circuit is provided with first and second variable delay circuits, a test data feeding circuitry, a test control circuit, and a wire-connection line. The test data feeding circuitry feeds first and second test data signals to the first and second variable delay circuits, respectively. The first and second test data signals are complement to each other. The test control circuit feeds first and second drive capability control signals to the first and second variable delay circuits to control drive capabilities of the first and second variable delay circuits. The wire-connection line provides a wire-connection for outputs of the first and second variable delay circuits.

8 Claims, 13 Drawing Sheets

RELATED ART    Fig. 1A
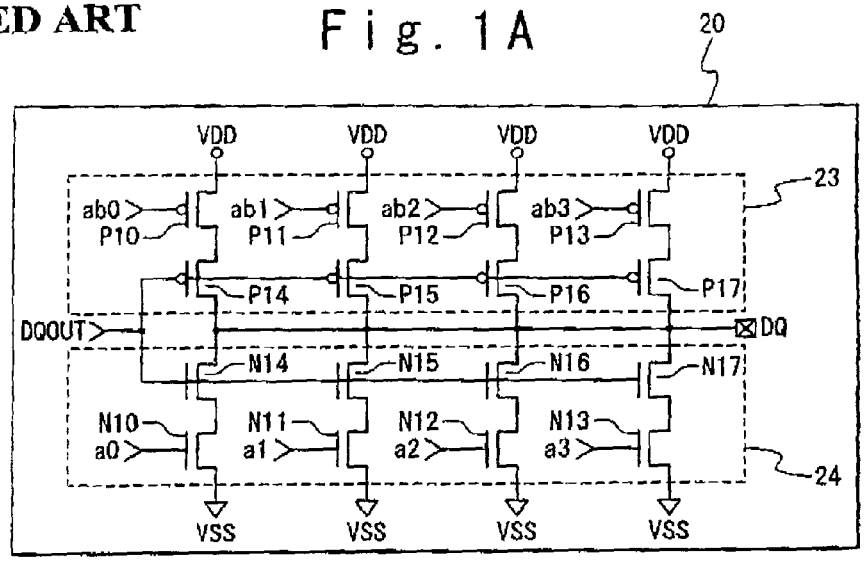
RELATED ART    Fig. 1B
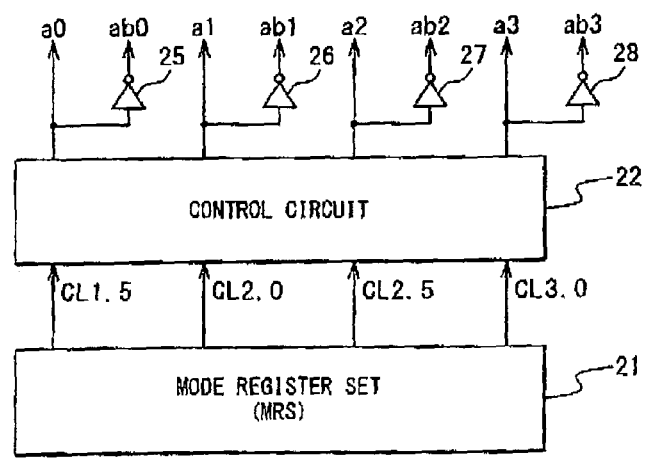

RELATED ART  Fig. 2A
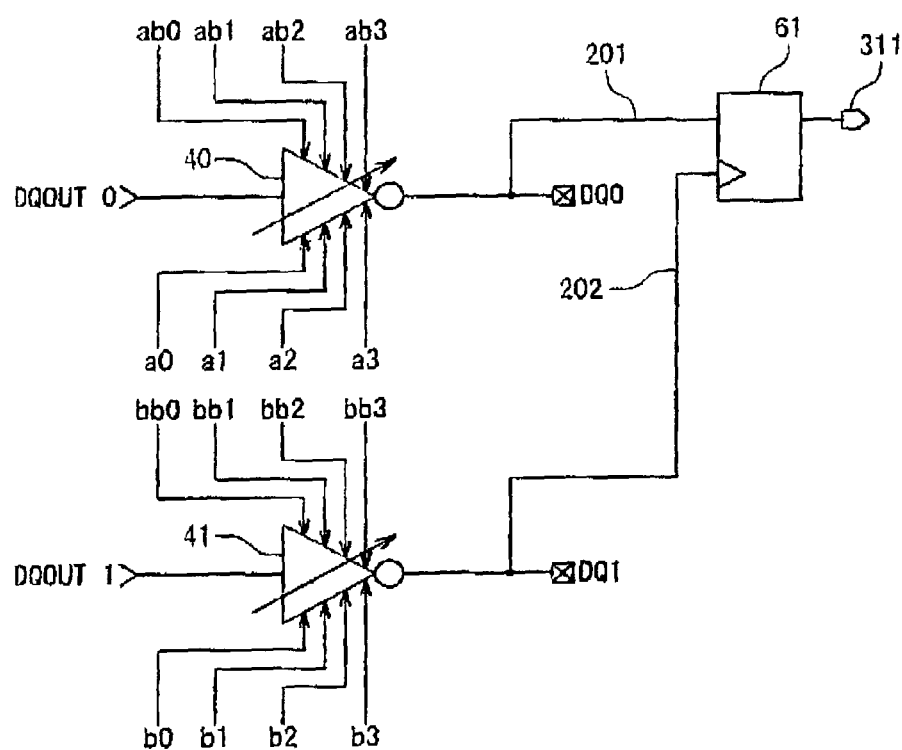

RELATED ART Fig. 2B
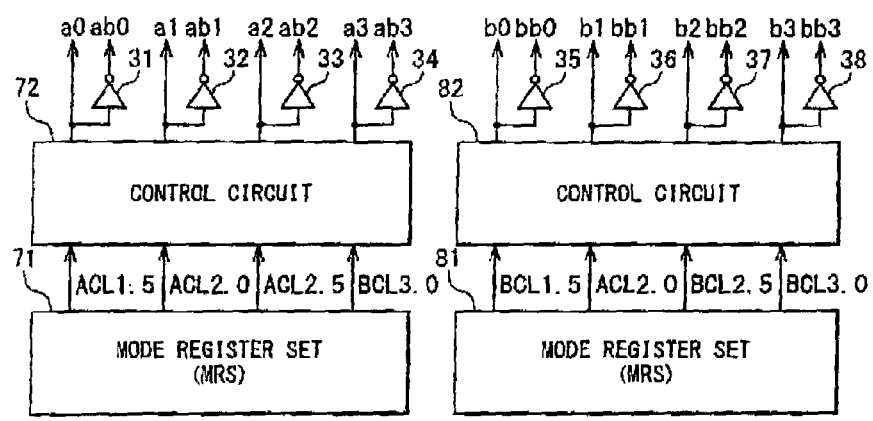

| TEST DATA SIGNAL 305 | DRIVE CAPABILITY SWITCH TEST SIGNAL 303 (8 BITS) | | | | | | | | DRIVE CAPABILITY SWITCH TEST SIGNAL 309 (8 BITS) | | | | | | | | EXPECTED VALUE OF SELECTED COMPARISON RESULT SIGNAL 313 |
|---|---|---|---|---|---|---|---|---|---|---|---|---|---|---|---|---|---|
| | BIT0 | BIT1 | BIT2 | BIT3 | BIT4 | BIT5 | BIT6 | BIT7 | BIT0 | BIT1 | BIT2 | BIT3 | BIT4 | BIT5 | BIT6 | BIT7 | |
| 0 | 0/1 | 1/0 | 1/0 | 1/0 | 1/0 | 1/0 | 1/0 | 1/0 | 1 | 1 | 1 | 1 | 1 | 1 | 1 | 1 | 0 |
| 0 | 1 | 1 | 1 | 1 | 1 | 1 | 1 | 1 | 0/1 | 1/0 | 1/0 | 1/0 | 1/0 | 1/0 | 1/0 | 1/0 | 1 |
| 1 | 0/1 | 1/0 | 1/0 | 1/0 | 1/0 | 1/0 | 1/0 | 1/0 | 1 | 1 | 1 | 1 | 1 | 1 | 1 | 1 | 1 |
| 1 | 1 | 1 | 1 | 1 | 1 | 1 | 1 | 1 | 0/1 | 1/0 | 1/0 | 1/0 | 1/0 | 1/0 | 1/0 | 1/0 | 0 |

INTEGRATED CIRCUIT ARCHITECTURE FOR TESTING VARIABLE DELAY CIRCUIT

INCORPORATION BY REFERENCE

This application claims the benefit of priority based on Japanese Patent Application No. 2008-220171, filed on Aug. 28, 2008, the disclosure of which is incorporated herein by reference.

BACKGROUND OF THE INVENTION

1. Field of the Invention

The present invention relates to an integrated circuit, more particularly, to a testing technique for variable delay circuits within an integrated circuit.

2. Description of the Related Art

Recently, performances of CPUs and memories have been increasingly improved, and the operating speeds of interfaces of the CPUs and memories have been enhanced accordingly. The enhancement of the operating speeds of the CPU and memory interfaces requires incorporating variable delay circuits within integrated circuits to provide delay adjustments of data buses connected among flipflops and system clocks fed to flipflops. The variable delay circuits allow offering sufficient setup times and hold times to flipflops within an integrated circuit in the high frequency operation.

Further operation speed enhancement in future requires minute adjustment of variable delay circuits. This undesirably makes it difficult to detect failures in the integrated circuit.

In and after the manufacture process of an integrated circuit, integrated circuits are tested to find failures therein. It is desirable for improving testability that all the circuits integrated can be tested by a built-in test technique.

In connection with a testing technique for variable delay circuits, Japanese Laid-Open Patent Application No. JP-A 2004-139718 discloses an output driver which is configured to adjust the delay thereof. This output driver includes an output terminal, a pull-up driver, a pull-down driver, and a mode register set. The pull-up driver pulls up the output terminal, while the pull-down driver pulls down the output terminal. The mode register set contains CAS (Column Address Strobe) latency information of the semiconductor memory. The output driver is adapted to adjust the drive capabilities of the pull-up and pull-down drivers in response to the CAS latency information.

FIGS. 1A and 1B are circuit diagrams illustrating the configuration of the output driver, denoted by the numeral 20, disclosed in this patent application. FIG. 1A shows the configuration of the output driver 20, and FIG. 2B shows the configuration of a controller circuitry connected to the output driver 20.

The output driver 20 is provided with a pull-up driver 23, a pull-down driver 24, an input terminal DQOUT and an output terminal DQ. The pull-up driver 23 includes a set of PMOS switch transistors P14 to P17 and a set of pull-up transistors P10 to P13. The pull-down driver 24 includes a set of NMOS switch transistors N14 to N17 and a set of pull-down transistors N10 to N13.

The control circuit 22 has a plurality of CAS latency inputs connected with a mode register set 21. The CAS latency inputs are denoted by the symbols CL1.5, CL2.0, CL2.5, and CL3.0, and associated with different CAS latencies of 1.5, 2.0, 2.5, and 3.0 clock cycles, respectively. One of the CAS latency inputs CL1.5, CL 2.0, CL2.5, and CL3.0 of the control circuit 22 is activated in response to the selection of the CAS latencies.

The control circuit 22 feeds drive capability control signals a0 to a3 to the gates of the pull-down transistors N10 to N13, respectively. The control signals a0 to a3 are also fed to the inverters 25 to 28. The inverters 25 to 28 generate inversed drive capability control signals ab0 to ab3 in response to the drive capability control signals a0 to a3, respectively.

The pull-up transistors P10 to P13 have sources connected to a power supply line VDD and drains connected to the sources of the PMOS switch transistors P14 to P17, respectively. In addition, the pull-up transistors P10 to P13 receive the inversed drive capability control signals ab0 to ab3 on the gates thereof, respectively. The PMOS switch transistors P14 to P17 have gates commonly connected to the input terminal DQOUT, and drains commonly connected to the output terminal DQ.

Correspondingly, the pull-down transistors N10 to N13 have sources connected to a ground line VSS and drains connected to the sources of the NMOS switch transistors N14 to N17, respectively. In addition, the pull-down transistors N10 to N13 receive the drive capability control signals a0 to a3 on the gates thereof, respectively. The NMOS switch transistors N14 to N17 have gates commonly connected to the input terminal DQOUT, and drains commonly connected to the output terminal DQ.

The pull-up transistors P10 to P13 are selectively enabled in response to the input signal received from the input terminal DQOUT and the inversed drive capability control signals ab0 to ab3, respectively. Correspondingly, the pull-down transistors N10 to N13 are selectively enabled in response to the input signal received from the input terminal DQOUT and the drive capability control, signals a0 to a3, respectively.

The pull-up driver 23 thus designed is used to pull up the output terminal DQ, and the pull-down driver 24 thus designed is used to pull down the output terminal DQ.

The mode register set 21 stores therein CAS latency information indicative of the CAS latency, and selectively activates one of the CAS latency inputs CL1.5, CL 2.0, CL2.5, and CL3.0 of the control circuit 22 in response to the stored CAS latency information.

The drive capabilities of the pull-up driver 23 and the pull-down driver 24 are adjusted in response to the CAS latency information stored in the mode register set 21. More specifically, the control circuit 22 outputs the drive capability control signals a0 to a3 in response to which of the CAS latency inputs CL information stored in the mode register set 21, and the inverters 25 to 28 outputs the inversed drive capability control signals ab0 to ab3 accordingly. The logic values of the inversed drive capability control signals ab0 to ab3 are complementary to those of the drive capability control signals a0 to a3. The drive abilities of the pull-up driver 23 and pull-down driver 24 shown in FIG. 1A are controlled in response to the control signals a0 to a3 and ab0 to ab3.

One common approach for detecting a failure in the output driver is to measure changes in the current on the output terminal DQ.

Recently, enhancement of the signal interfacing speed of the system has been strongly desired, and this requires latching data on a data bus within the integrated circuit with a high frequency system clock.

The use of the high frequency system clock makes it difficult to assure sufficient setup times and hold times for respective flipflops due to undesired delay variations in the clock distribution system and data bus. In order to address this problem, variable delay circuits are integrated within the semiconductor integrated circuit to assure sufficient setup times and hold times for respective flipflops within the integrated circuit.

One approach for achieve minute delay adjustment of the clock distribution system and data bus may be to incorporate the circuit shown in FIG. 1A within the clock distribution system and data bus; however, this approach is not preferable in terms of testability. Variable delay circuits which adjust delays of data signals and clock signals exchanged between flipflops within the integrated circuit are not directly connected to external output pads. This implies that changes in the currents in the case of failure cannot be detected. When the output driver 20 shown in FIG. 1A is integrated within the internal circuit of a semiconductor integrated circuit, the failure of the output driver 20 cannot be detected.

One approach for addressing the problem of the failure detection may be to incorporate a built-in test circuit. FIGS. 2A and 2B show an exemplary configuration of a delay adjustment circuitry which incorporates a built-in test circuit. FIG. 2A shows connections between variable delay circuits and the built-in test circuit in the delay adjustment circuitry, and FIG. 2B shows an exemplary configuration of a control signal generator circuitry in the delay adjustment circuitry.

The delay adjustment circuitry shown in FIGS. 2A and 2B includes a pair of variable delay circuits 40 and 41 and a built-in test circuit. The variable delay circuit 40 has an input connected to an input terminal DQOUT0 and an output connected to an output terminal DQ0. Correspondingly, the variable delay circuit 41 has an input connected to an input terminal DQOUT1 and an output connected to an output terminal DQ1. The built-in test circuit includes a test flipflop circuit 61 which outputs an output signal 311 from the output thereof.

The control signal generator circuitry includes mode register sets 71 and 81, control circuits 72 and 82, and inverters 31 to 38.

The control circuit 72 has a set of CAS latency inputs ACL1.5, ACL2.0, ACL2.5, and ACL3.0, and generates drive capability control signals a0 to a3 in response to selection of the CAS latency inputs ACL1.5, ACL2.0, ACL2.5, and ACL3.0. Here, the CAS latency inputs ACL1.5, ACL2.0, ACL2.5 and ACL3.0 are associated with CAS latencies of 1.5, 2.0, 2.5 and 3.0 clock cycles, respectively. The mode register set 71 stores the CAS latency information indicative of the CAS latency to be set for the variable delay circuit 40, and activates selected one of the CAS latency inputs ACL1.5, ACL2.0, ACL2.5, and ACL3.0 of the control circuit 72 in response to the CAS latency information stored therein.

Correspondingly, the control circuit 82 has a set of CAS latency inputs BCL1.5, BCL2.0, BCL2.5, and BCL3.0, and generates drive capability control signals b0 to b3 in response to selection of the CAS latency inputs BCL1.5, BCL2.0, BCL2.5, and BCL3.0. Here, the CAS latency inputs BCL1.5, BCL2.0, BCL2.5 and BCL3.0 are associated with CAS latencies of 1.5, 2.0, 2.5 and 3.0 clock cycles, respectively. The mode register set 81 stores the CAS latency information indicative of the CAS latency to be set for the variable delay circuit 41, and activates selected one of the CAS latency inputs BCL1.5, BCL2.0, BCL2.5, and BCL3.0 of the control circuit 82 in response to the CAS latency information stored therein.

The inverters 31 to 34 receive the drive capability control signals a0 to a3 on the inputs, and generate inverted drive capability control signals ab0 to ab3, respectively, in response to the drive capability control signals a0 to a3. Correspondingly, the inverters 35 to 38 receive the drive capability control signals b0 to b3 on the inputs, and generate inverted drive capability control signals bb0 to bb3, respectively, in response to the drive capability control signals b0 to b3.

The operations of the mode register sets 71, 81 and the control circuits 72 and 82 are identical to those of the mode register set 21 and the control circuit 22 shown in FIG. 1B, respectively.

Referring back to FIG. 2A, the configurations and operations of the variable delay circuits 40 and 41 are identical to those of the variable delay circuit 20. Here, it should be noted that the variable delay circuit 41 uses the drive capability control signals b0 to b3 and inverted drive capability control signals bb0 to bb3, in place of the drive capability control signals a0 to a3 and inverted drive capability control signals ab0 to ab3, respectively.

The output of the variable delay circuit 40 is connected to the data input of the test flipflop 61 through a signal line 201 and the output of the variable delay circuit 41 is connected to the clock input of the test flipflop 61 through a signal line 202. The signal lines 201 and 202 transmit the output signals of the variable delay circuits 40 and 41, respectively. The signal lines 201 and 202 are routed so that the delay of the signal line 201 is identical to that of the signal line 202.

The test flipflop circuit 61 is used to determine the adjusted delay difference between the variable delay circuits 40 and 41. Here, when there is a difference in the delay between the signal lines 201 and 202 due to manufacture variations, for example, the adjusted delay difference determined by the test flipflop circuit 61 includes the difference in the delay between the signal lines 201 and 202. In such a case, the test flipflop circuit 61 cannot determine the adjusted delay difference between the variable delay circuits 40 and 41, accurately.

Let us consider the case where the desired adjusted delay difference between the variable delay circuits 40 and 41 is as small as 10 ps, and there is a delay difference of 20 ps between the signal lines 201 and 202, for example. In this case, the adjusted delay difference is incorrectly determined on the input of the test flipflop circuit 61.

In the following, a description is given of an exemplary operation for failure detection of the delay adjustment circuitry shown in FIGS. 2A and 2B.

The control circuit 72 sets the drive capability control signals a0 to a3 to desired levels under the control of the mode register set 71, and the inverters 31 to 34 set the inverted drive capability control signals ab0 to ab3 to the complementary levels to those of the drive capability control signals a0 to a3. Correspondingly, the control circuit 82 sets the drive capability control signals b0 to b3 to desired levels under the control of the mode register set 81, and the inverters 35 to 38 set the inverted drive capability control signals bb0 to bb3 to the complementary levels to those of the drive capability control signals b0 to b3.

The drive capability control signals a0 to a3, b0 to b3, and the inverted drive capability control signals ab0 to ab3 and bb0 to bb3 are set so that the drive capability of the variable delay circuit 40 are different from that of the variable delay circuit 41.

This is followed by feeding signals to the input terminals DQOUT0 and DQOUT1 at the same time.

As a result, the variable delay circuits 40 and 41 outputs the output signals with delay times controlled by the drive capabilities set thereto. The difference in the drive capability between the variable delay circuits 40 and 41 is observed as the adjusted delay difference.

The test flipflop circuit 61 is triggered by the rising edge of the output signal of the variable delay circuit 41, which is fed to the clock input of the test flipflop circuit 61, to latch the output signal of the variable delay circuit 40, which is fed to the data input of the test flipflop circuit 61. The output signal 311 is outputted from the test flipflop circuit 61 in response to the signal latched by the test flipflop circuit 61.

When the drive capabilities of the variable delay circuits 40 and 41 are successfully controlled in response to the setting values stored in the mode register sets 71 and 81, the adjusted delay difference is observed in the output signals of the adjustment circuits 40 and 41 on the signal lines 201 and 202 as expected.

When there is no failure in the variable delay circuits 40 and 41, the output signals of the variable delay circuits 40 and 41 exhibit an expected adjusted delay difference in accordance with the set values of the drive capability control signals a0 to a3, b0 to b3, and inversed drive capability control signals ab0 to ab3 and bb0 to bb3. It should be noted that, hereinafter, the value of the output signal 311 in the case where the variable delay circuits 40 and 41 operates as desired in response to the drive capability control signals a0 to a3, b0 to b3, and the inverted drive capability control signals ab0 to ab3 and bb0 to bb3 is referred to as the "expected value". When the actual value of the output signal 311 of the test flipflop circuit 61 is coincident with the expected value, this confirms that the transistors within the variable delay circuits 40 and 41 operate normally.

When there is any failure in the variable delay circuits 40 and 41, on the other hand, the adjusted delay difference between the variable delay circuits 40 and 41 does not match the setting values of the drive capability control signals a0 to a3, b0 to b3, and the inverted drive capability control signals ab0 to ab3 and bb0 to bb3. As a result, the actual value of the output signal 311 outputted by the test flipflop circuit 61 does not match the expected value. This allows detecting the failure in the drive capability adjustment of the transistors within the variable delay circuits 40 and 41.

It should be noted that the inputs of the control circuits 72 and 82 may be controlled by any means other than the mode register sets 71 and 81. For example, the controls of the inputs of the control circuits 72 and 82 may be achieved by the output signals of a counter used for drive ability control, or externally-received signals fed to external test pads.

The failure detection architecture shown in FIGS. 2A and 2B requires eliminating the delay difference between the signal lines 201 and 202 connected between the test flipflop circuit 61 and the variable delay circuits 40 and 41.

One issue is the reduction in the allowed delay adjustment amount due to the enhancement in the operation speed of the system, including a CPU and memories. This may result in that the difference in the delay between the signal lines 201 and 202 caused by interconnection delay variations and/or manufacture variations exceeds the allowed delay adjustment amount. In this case, the difference in the delay caused by interconnection delay variations and/or manufacture variations may be observed as the output signal 311 of the test flipflop circuit 61 in place of the adjusted delay difference between the variable delay circuits 40 and 41. This may cause improper determination of the adjusted delay difference between the variable delay circuits 40 and 41.

This problem may be addressed to some extent, by improving the routing accuracy of the signal lines 201 and 202, which are designed to have the same length, in the circuit layout; however, this approach will face severe difficulty when the allowed adjusted delay difference is significantly reduced down to several pico seconds or less.

Let us consider a case where the adjusted delay difference between the variable delay circuits 40 and 41 is as small as 3 ps, and the delay difference between the signal lines 201 and 202, which is caused by interconnection delay variations and/or manufacture variations, is 6 ps. In this case, the adjusted delay difference between the variable delay circuits 40 and 41 is incorrectly observed on the input terminal of the test flipflop circuit 61 and the test flipflop circuit 61 unsuccessfully determines the adjusted delay difference. In order to address this unsuccessful determination, one approach may be to modify interconnection routing for improving the interconnection delay variations. This approach, however, faces severe difficulty in addressing the delay difference of 6 ps between the signal lines 201 and 202. The test flipflop circuit 61, which observes the adjusted delay difference between the variable delay circuits 40 and 41 influenced by the undesired delay difference exceeding the adjusted delay difference, undesirably outputs an incorrect result as the output signal. This results in that an improper checking of the output signal 311 against the expected value. In other words, the built-in test architecture shown in FIGS. 2A and 2B suffers from a problem that the failure of the variable delay circuits 40 and 41, which provide minute delay adjustments, cannot be detected in the semiconductor integrated circuit.

SUMMARY OF THE INVENTION

In an aspect of the present invention, an integrated circuit is provided with first and second variable delay circuits, a test data feeding circuitry, a test control circuit, and a wire-connection line. The test data feeding circuitry feeds first and second test data signals to the first and second variable delay circuits, respectively. The first and second test data signals are complement to each other. The test control circuit feeds first and second drive capability control signals to the first and second variable delay circuits to control drive capabilities of the first and second variable delay circuits. The wire-connection line provides a wire-connection for outputs of the first and second variable delay circuits.

In another aspect of the present invention, a test method of testing variable delay circuits, comprising: feeding first and second test data signals to first and second variable delay circuits, respectively, the first and second test data signals being complement to each other; feeding first and second drive capability control signals to the first and second variable delay circuits to control drive capabilities of the first and second variable delay circuits; generating an output signal depending on a voltage level on a wire-connection line commonly connected to outputs of the first and second variable delay circuits; and checking an actual value of the output signal against an expected value.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A and 1B are circuit diagrams showing the configuration of a conventional output driver adapted to delay adjustment;

FIGS. 2A and 2B are circuit diagrams showing the configuration of a delay adjustment circuitry with a conventional built-in test circuit;

FIG. 8A is a table showing an example of test patterns and expected values used for testing the variable delay circuits;

FIG. 8B is a table showing another example of test patterns and expected values used for testing the variable delay circuits;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(First Embodiment)

Figure 3:
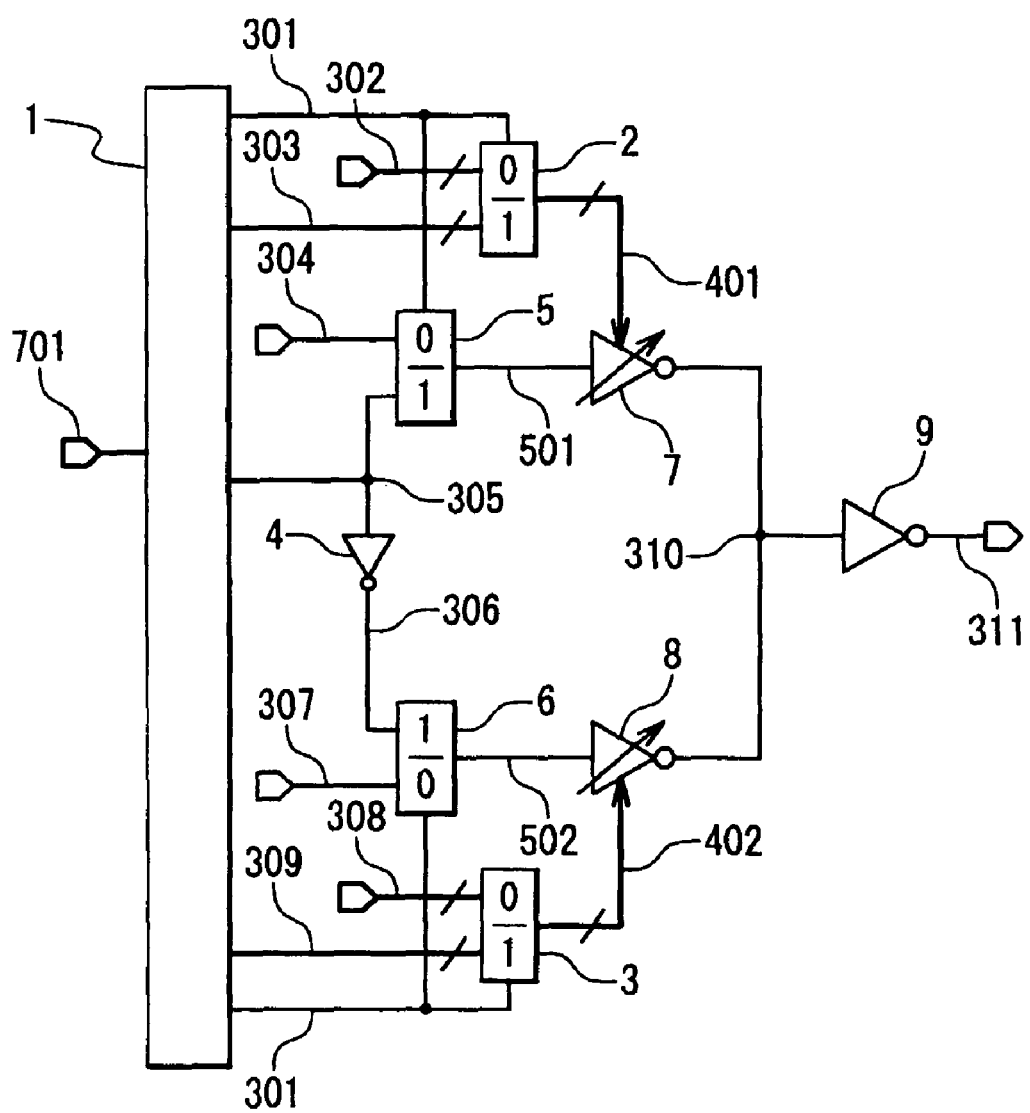
FIG. 3 is a circuit diagram showing exemplary configurations of a built-in test circuit testing variable delay circuits in a first embodiment of the present invention.

FIG. 3 is a circuit diagram illustrating an exemplary configuration of a built-in test circuit used for testing variable delay circuits in a first embodiment of the present invention.

The circuit shown in FIG. 3 is provided with a pair of variable delay circuits 7, 8 and a built-in test circuit connected to the variable delay circuits 7 and 8. The test circuit is provided with a test control circuit 1, four switches 2, 3, 5 and 6, a test data signal inverter 4, an output inverter 9, and a wire-connection line 310. The wire-connection line 310 provides a wired connection for the outputs of the variable delay circuits 7 and 8.

The test control circuit 1 generates a test enable signal 301, two sets of drive capability switch test signals 303 and 309, and a test data signal 305 in response to test bus signals 701 fed from external contact pads (not shown) to indicate performing a built-in test. The test enable signal 301 is used to control the switches 2, 3, 5 and 6 to perform the test of the variable delay circuits 7 and 8. The drive capability switch test signals 303 and 309 are used to control drive capabilities of the variable delay circuits 7 and 8, respectively, in pulling up and down the outputs thereof during the built-in test.

The switch 2 receives normal operation drive capability control signals 302 and the drive capability switch test signals 303. The switch 2 is responsive to the test enable signal 301 for selecting one of the two sets of the normal operation drive capability control signals 302 and the drive capability switch test signals 303. When the test enable signal 301 is activated, the switch 2 selects the drive capability switch test signals 303; otherwise the switch 2 selects the normal operation drive capability control signals 302. The selected set of the signals are fed to the variable delay circuit 7 as drive capability control signals 401.

The switch 3 receives normal operation drive capability control signals 308 and the drive capability switch test signals 309. The switch 3 selects one of the two sets of the normal operation drive capability control signals 308 and the drive capability switch test signals 309 in response to the test enable signal 301. When the test enable signal 301 is activated, the switch 3 selects the drive capability switch test signals 309; otherwise the switch 2 selects the normal operation drive capability control signals 308. The selected set of the signals are fed to the variable delay circuit 8 as drive capability control signals 402.

The test data signal inverter 4, the switches 5 and 6 function as a test data feeding circuitry which feeds complementary test data signals to the variable delay circuits 7 and 8.

More specifically, the test data signal inverter 4 receives the test data signal 305 and generates an inverted test data signal 306 which is complementary to the test data signal 305.

The switch 5 selects one of a normal operation data signal 304 and the test data signal 305 in response to the test enable signal 301. When the test enable signal 301 is activated, the switch 5 selects the test data signal 305; otherwise, the switch 5 selects the normal operation data signal 304. The selected data signal, denoted by the numeral 501, is fed to the variable delay circuit 7.

Correspondingly, the switch 6 selects one of a normal operation data signal 307 and the inverted test data signal 306 in response to the test enable signal 301. When the test enable signal 301 is activated, the switch 6 selects the inverted test data signal 306; otherwise, the switch 6 selects the normal operation data signal 307. The selected data signal, denoted by the numeral 502, is fed to the variable delay circuit 8.

The output inverter 9 has an input connected to the wire-connection line 310 and outputs an output signal 311. The output inverter 9 is responsive to the voltage level on the wire-connection line 310. When the voltage level on the wire-connection line 310 exceeds a certain threshold level, the output inverter 9 pulls down the output signal 311; otherwise, the output inverter 9 pulls up the output signal 311.

The variable delay circuit 7 provides delay for the selected data signal 501 fed to the input thereof. The output of the variable delay circuit 7 is connected to the wire-connection line 310. The drive capabilities of the variable delay circuit 7 in pulling up and down the wire-connection line 310 are controlled on the drive capability control signals 401.

Correspondingly, the variable delay circuit 8 provides delay for the selected data signal 502 fed to the input thereof. The output of the variable delay circuit 8 is connected to the wire-connection line 310. The drive capabilities of the variable delay circuit 8 in pulling up and down the wire-connection line 310 are controlled on the drive capability control signals 402.

In one embodiment, the configurations of the variable delay circuits 7 and 8 are identical to that of the circuit shown in FIG. 1A. In this case, the variable delay circuits 7 and 8 are each provided with a pull-up driver 23, a pull-down driver 24, an input terminal DQOUT and an output terminal DQ. The selected data signals 501 and 502 are fed to the input terminals DQOUT of the variable delay circuits 7 and 8, respectively. The output terminals DQ of the variable delay circuits 7 and 8 are commonly connected to the wire-connection line 310. The sets of the selected drive capability control signals 401 each include drive capability control signals a0 to a3, and inverted drive capability control signals ab0 to ab3.

The pull-up driver 23 includes a set of PMOS switch transistors P14 to P17 and a set of pull-up transistors P10 to P13. The pull-down driver 24 includes a set of NMOS switch transistors N14 to N17 and a set of pull-down transistors N10 to N13.

The pull-up transistors P10 to P13 have sources connected to a power supply line VDD and drains connected to the sources of the PMOS switch transistors P14 to P17, respectively. In addition, the pull-up transistors P10 to P13 receive the inversed drive capability control signals ab0 to ab3 on the gates thereof, respectively. The PMOS switch transistors P14 to P17 have gates commonly connected to the input terminal DQOUT, and drains commonly connected to the output terminal DQ.

Correspondingly, the pull-down transistors N10 to N13 have sources connected to a ground line VSS and drains connected to the sources of the NMOS switch transistors N14 to N17, respectively. In addition, the pull-down transistors N10 to N13 receive the drive capability control signals a0 to a3 on the gates thereof, respectively. The NMOS switch transistors N14 to N17 have gates commonly connected to the input terminal DQOUT, and drains commonly connected to the output terminal DQ.

The pull-up transistors P10 to P13 are selectively enabled in response to the input signal received from the input terminal DQOUT and the inversed drive capability control signals ab0 to ab3, respectively. Correspondingly, the pull-down transistors N10 to N13 are selectively enabled in response to the input signal received from the input terminal DQOUT and the drive capability control signals a0 to a3, respectively.

The pull-up driver 23 thus designed is used to pull up the output terminal DQ, and the pull-down driver 24 thus designed is used to pull down the output terminal DQ.

Figure 4:
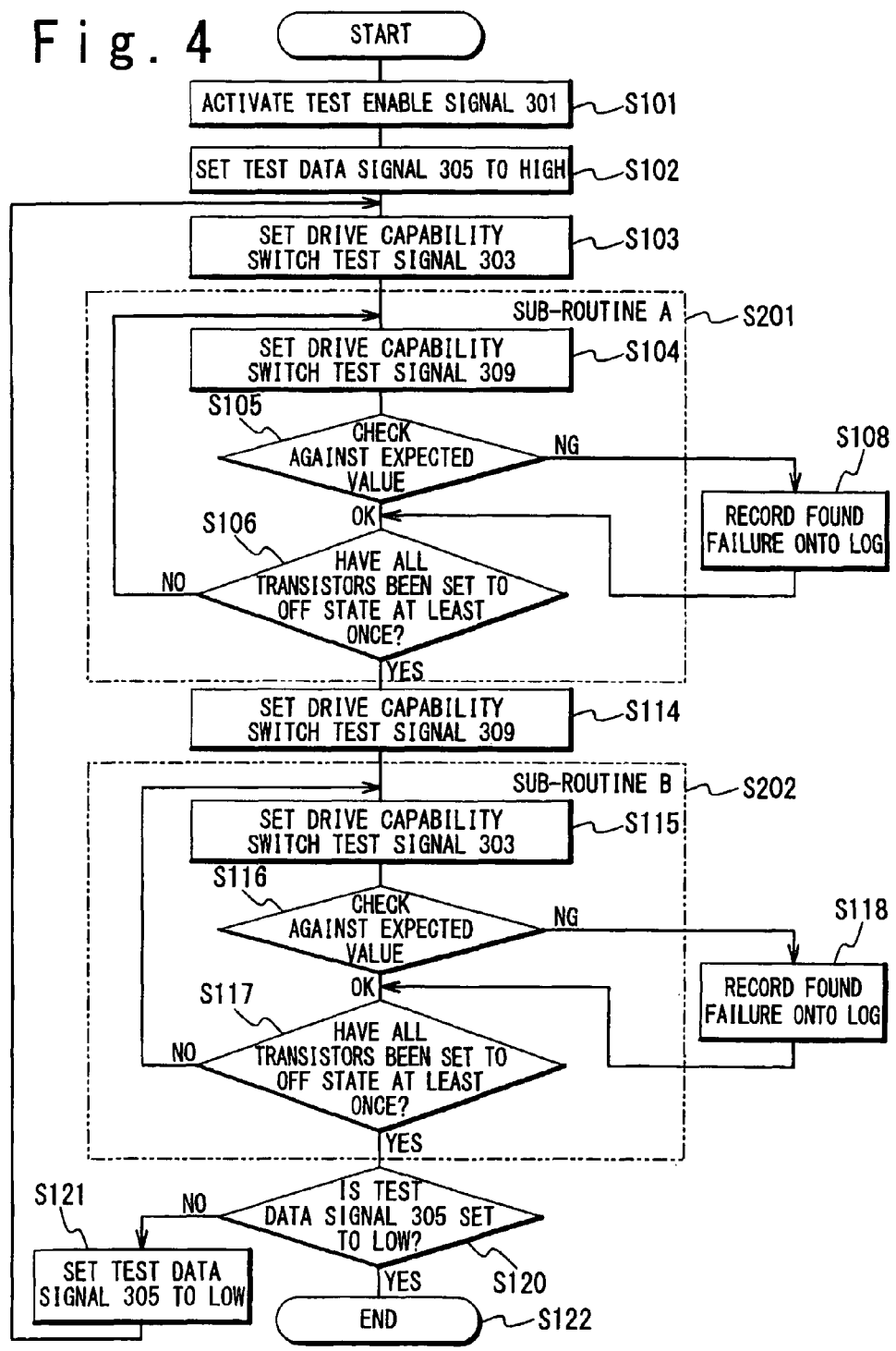
FIG. 4 is a flowchart showing an exemplary procedure of the delay test in the first embodiment.

FIG. 4 is a flowchart showing an exemplary procedure for performing a built-in test of the variable delay circuits 7 and 8 in this embodiment.

The test procedure begins with activation of the test enable signal 301 at Step S101. The activation of the test enable signal 301 allows the switches 2 and 7 to feed the test data signal 305 and the drive capability switch test signals 303 to the variable delay circuit 7, respectively. The activation of the test enable signal 301 also allows the switches 3 and 6 to feed the inverted test data signal 306 and the drive capability switch test signals 309 to the variable delay circuit 8, respectively.

After Step S101, the test data signal 305 is set to the high level at Step S102. This results in that the inverted test data signal 306 is set to the low level.

Subsequently, the drive capability switch test signals 303 are set at Step S103 so that the pull-up transistors P10 to P13 and the pull-down transistors N10 to N13 are all placed into the ON state in the variable delay circuit 7.

This is followed by performing a sub-routine A at Step S201. In the sub-routine A, the drive capability switch test signals 309 are set at Step S104 so that only one of the pull-up transistors P10 to P13 and only one of the pull-down transistors N10 to N13 are placed into the ON state in the variable delay circuit 8.

This is followed by checking the output signal 311 of the inverter 9 against a predetermined expected value, which is predetermined depending on the values of the drive capability switch test signals 303 and 309, at Step S105. It should be noted that the voltage level on the wire-connection line 310 depends on the actual drive capabilities of the pull-up driver 23 and pull-down driver 24 within the variable delay circuits 7 and 8, and the output signal 311 depends on the voltage level on the wire-connection line 310. When the voltage level on the wire-connection line 310 is higher than the threshold level of the inverter 9, the output signal 311 is set to the low level. Otherwise, the output signal 311 is set to the high level. Therefore, the output signal 311 indicates the actual drive capabilities of the pull-up driver 23 and pull-down driver 24 within the variable delay circuits 7 and 8. This implies that the comparison of the actual value of output signal 311 with the expected value allows determining whether the drive capabilities of the pull-up driver 23 and pull-down driver 24 within the variable delay circuits 7 and 8 are actually controlled as indicated by the drive capability switch test signals 303 and 309.

When the value of the output signal 311 does not match the expected value, it is determined that there is a failure within the variable delay circuit 8, and this fact is recorded onto a test log at Step S108.

When the value of the output signal 311 matches the expected value, on the other hand, this implies that no failure is found in the variable delay circuit 8.

Subsequently, it is determined at Step S106 whether all the pull-up transistors P10 to P13 and pull-down transistors N10 to N13 have been placed into the OFF state at least once within the variable delay circuit 8 in the currently-executed sub-routine A.

When any of the pull-up transistors P10 to P13 and pull-down transistors N10 to N13 has not yet been placed into the OFF state within the variable delay circuit 8, the procedure returns to Step S104. At Step S104, the drive capability switch test signals 309 are set so that one pull-up transistor and one pull-down transistors which have not yet been placed into the OFF state are placed into the OFF state within the variable delay circuit 8, and the procedure goes to Step S105. Thereafter, Step S104 to S106 are repeated in the sub-routine A until all the pull-up transistors P10 to P13 and pull-down transistors N10 to N13 have been placed into the OFF state at least once in the currently-executed sub-routine A.

When it is determined at Step S106 that all the pull-up transistors P10 to P13 and pull-down transistors N10 to N13 have been placed into the OFF state at least once, the procedure goes to Step S114.

At Step S114, the drive capability switch test signals 309 are set so that the pull-up transistors P10 to P13 and the pull-down transistors N10 to N13 are all placed into the ON state in the variable delay circuit 8.

This is followed by performing a sub-routine B at Step S202. In the sub-routine B, the drive capability switch test signals 303 are set at Step S115 so that only one of the pull-up transistors P10 to P13 and only one of the pull-down transistors N10 to N13 are placed into the ON state in the variable delay circuit 7.

The output signal 311 of the inverter 9 is checked against a predetermined expected value, which is predetermined depending on the values of the drive capability switch test signals 303 and 309, at Step S116.

When the value of the output signal 311 does not match the expected value, it is determined that there is a failure within the variable delay circuit 8, and this fact is recorded onto a test log at Step S118.

When the value of the output signal 311 matches the expected value, on the other hand, this implies that no failure is found in the variable delay circuit 7.

Subsequently, it is determined at Step S117 whether all the pull-up transistors P10 to P13 and pull-down transistors N10 to N13 within the variable delay circuit 7 have been placed into the OFF state at least once in the currently-executed sub-routine B.

When any of the pull-up transistors P10 to P13 and pull-down transistors N10 to N13 within the variable delay circuit 7 has not yet been placed into the OFF state, the procedure returns to Step S115. At Step S115, the drive capability switch test signals 303 are set so that one pull-up transistor and one pull-down transistors which have not yet been placed into the OFF state are placed into the OFF state within the variable delay circuit 7, and the procedure goes to Step S116. Thereafter, Step S115 to S117 are repeated in the sub-routine B until all the pull-up transistors P10 to P13 and pull-down transistors N10 to N13 have been placed into the OFF state at least once within the variable delay circuit 7 in the currently-executed sub-routine B.

When it is determined at Step S106 that all the pull-up transistors P10 to P13 and pull-down transistors N10 to N13 have been placed into the OFF state at least once, on the other hand, the procedure goes to Step S120.

At Step S120, it is determined whether the test data signal 305 has been set to the low level. When the test data signal 305 is determined as not being set to the low level, the procedure goes to Step S121.

At Step S121, the test data signal 305 is set to the low level. The procedure then goes back to Step S103, and the sub-routine A, Step S114 and the sub-routine B are executed again. It should be noted that the test data signal 305 is already set to the low level when the procedure goes to Step S120 again.

When the test data signal 305 is determined as being set to the low level at Step S120, this implies that all the test patterns have been subjected to failure detection for the transistors within the variable delay circuits 7 and 8. The failure detection procedure is then completed at Step S122.

It should be noted that the test bus signals 701 are used to provide test configurations directly from the external contact pads. The test control circuit 1 is responsive to the test bus signals 701 for controlling the states of the test enable signal 301, the test data signal 305 and the drive capability switch test signals 309 and 303 to perform failure detection. When the test control circuit 1 incorporates a test pattern decoder and a state machine, the control of the test enable signal 301, the test data signal 305 and the drive capability switch test signals 309 and 303 can be automated in the test control circuit 1.

The variable delay circuit testing architecture of this embodiment effectively resolves the problem of the conventional testing technique as follows:

The variable delay circuits 7 and 8 receive signals of complementary levels; the variable delay circuit 7 receives the test data signal 305, while the variable delay circuit 8 receives the inverted test data signal 306. Therefore, the voltage levels of the output signals of the variable delay circuits 7 and 8 are different from each other. In addition, the outputs of the variable delay circuits 7 and 8 are wire-connected. As a result, the actual voltage level on the wire-connection line 310 depends on one of the variable delay circuits 7 and 8 which has a higher drive capability.

The testing architecture of this embodiment allows checking the drive capability difference between the variable delay circuits 7 and 8 for all the transistors integrated therein for all the ON-OFF patterns of the transistors. This allows performing failure detection test regardless of the test circuit operation margin even when the allowed delay adjustment amount of the variable delay circuits 7 and 8 is reduced.

(Second Embodiment)

Figure 5:
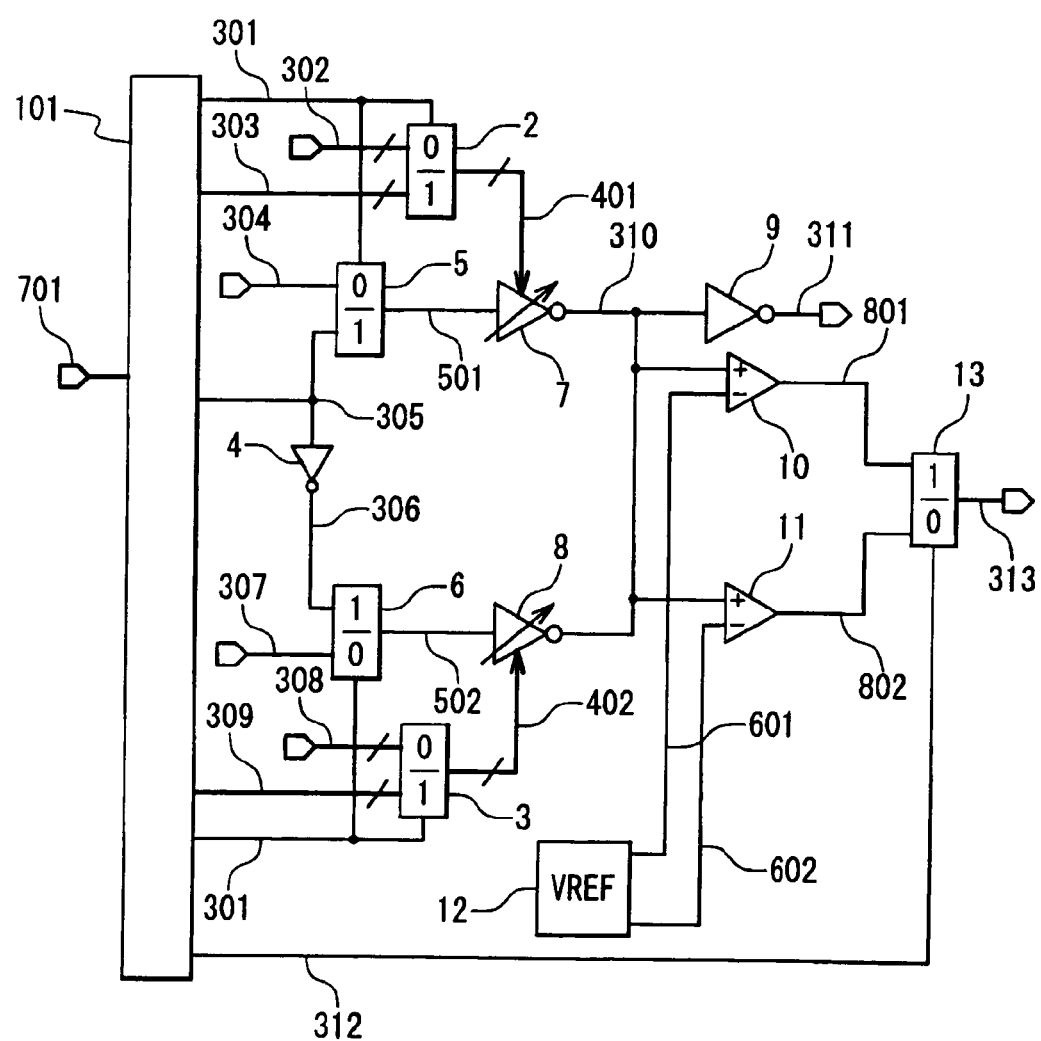
FIG. 5 is a circuit diagram showing an exemplary configuration of a built-in test circuit testing variable delay circuits in a second embodiment of the present invention.

FIG. 5 is a circuit diagram showing an exemplary configuration of a test circuit for testing variable delay circuits in a second embodiment of the present invention. In the second embodiment, the test circuit additionally includes comparators 10 and 11, a reference voltage generator circuit 12, and a switch 13. The test control circuit 101, which operates in almost the same way as the test control circuit 1 of the first embodiment, generates an expected value switch signal 312. The expected value switch signal 312 is controlled in response to the test bus signals 701 fed to the external contact pads.

The wire-connection line 310, which is connected to the outputs of the variable delay circuits 7 and 8 and the input of the inverter 9, is additionally connected to one of the inputs of the comparator 10 and one of the inputs of the comparator 11. One output of the reference voltage generator circuit 12 is connected to the other input of the comparator 10, and the other output of the reference voltage generator circuit 12 is connected to the other input of the comparator 11. The output of the comparator 10 is connected to the first input of the switch 13 and the output of the comparator 11 is connected to the second input of the switch 13. The switch 13 receives the expected value switch signal 312 on the control input thereof.

The reference voltage generator circuit 12 generates a high-side reference voltage signal 601 and a low-side reference voltage signal 602.

The comparator 10 compares the voltage level of the high-side reference voltage signal 601 and the voltage level on the wire-connection line 310 to generate a comparator output signal 801. Correspondingly, the comparator 11 compares the voltage level of the low-side reference voltage signal 602 and the voltage level on the wire-connection line 310 to generate a comparator output signal 802.

The switch 13 selects one of the comparator output signals 801 and 802 in response to the expected value switch signal 312 received from the test control circuit 101, and outputs the selected output signal as a selected comparison result signal 313.

The circuit operation in this embodiment is as follows:

The comparator 10 pulls up the comparator output signal 801 to the high level when the voltage level on the wire-connection line 310 is higher than that of the high-side reference voltage signal 601. When the voltage level on the wire-connection line 310 is lower than that of the high-side reference voltage signal 601, on the other hand, the comparator 10 pulls down the comparator output signal 801 to the low level.

Correspondingly, the comparator 11 pulls up the comparator output signal 802 to the high level when the voltage level on the wire-connection line 310 is higher than that of the low-side reference voltage signal 602. When the voltage level on the wire-connection line 310 is lower than that of the high-side reference voltage signal 602, on the other hand, the comparator 11 pulls down the comparator output signal 802 to the low level.

The test control circuit 101 sets the expected value switch signal 312 in response to the test bus signals 701. In detail, the expected value switch signal 312 is set so that the switch 13 selects the comparator output signal 801 as the selected comparison result signal 313, when the expected value of the selected comparison result signal 313 is the high level. When the expected value of the selected comparison result signal 313 is the low level, on the other hand, the expected value switch signal 312 is set so that the switch 13 selects the comparator output signal 802 as the selected comparison result signal 313.

When the drive capability difference between the variable delay circuits 7 and 8 is extremely small, the voltage level on the wire-connection line 310 should be detected with high precision. The circuit architecture shown in FIG. 5, in which the wire-connection line 310 are connected to the inputs of two comparators to output selected one of the comparison results obtaining by comparing the voltage level on the wire-connection line 310 with different reference voltages, allows determining an extremely reduced drive capability difference between the two variable delay circuits. This allows testing variable delay circuits adapted to the further high speed operation.

Figure 6:
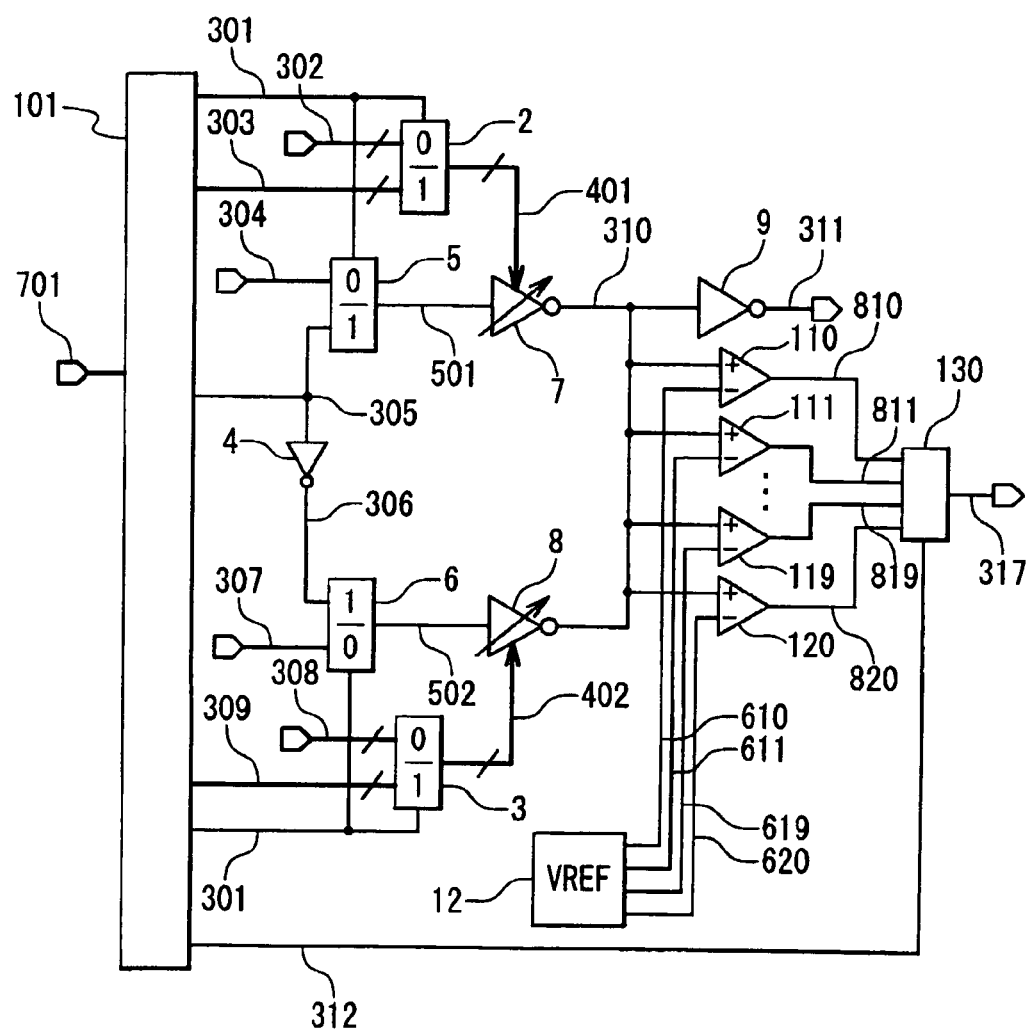
FIG. 6 is a circuit diagram showing another exemplary configuration of a built-in test circuit testing variable delay circuits in a second embodiment of the present invention.

FIG. 6 is a circuit diagram showing another exemplary configuration of the test circuit of this embodiment. In the circuit shown FIG. 6, an increased number of reference voltages are used. In one embodiment, 11 reference voltages are used as shown in FIG. 6.

In the circuit configuration shown in FIG. 6, 11 comparators 110 to 120 are connected to the reference voltage generator circuit 12. The reference voltage generator circuit 12 feeds reference voltage signals 610 to 620 to the comparators 110 to 120, respectively. The outputs of the comparators 110 to 120 are connected to a voltage range determining logic circuit 130. The voltage range determining logic circuit 130 receives the comparator output signals 810 to 820 from the comparators 110 to 120 to generate a voltage range identifying signal 317 indicative of the voltage range in which the voltage level on the wire-connection line 310 resides.

The circuit configuration shown in FIG. 6 allows determining the voltage level on the wire-connection line 310 with high precision compared with the circuit configuration shown in FIG. 5. In one embodiment, the voltage levels of the reference voltage signals 610 to 620 are set to range from 1.0 V to 2.0 V with 0.1 V increments in between. The comparators 110 to 120 outputs the comparison results obtained by comparing the voltage level on the wire-connection line 310 with those of the reference voltage signals 610 to 620, respectively. When the comparator output signals 810 to 815 are set to the low level and the comparator output signals 816 to 820 are set to the high level, for example, this implies that the voltage level on the wire-connection line 310 is in the range from 1.5 V to 1.6 V. The voltage range determining logic circuit 130 outputs the voltage range identifying signal 317 in accordance with the comparison results. It is preferable that the voltage range identifying signal 317 is a digital signal.

In an alternative embodiment, only one comparator may be provided. In this case, the switch 13 or voltage range determining logic circuit 130 is removed from the test circuit.

(Third Embodiment)

Figure 7A:
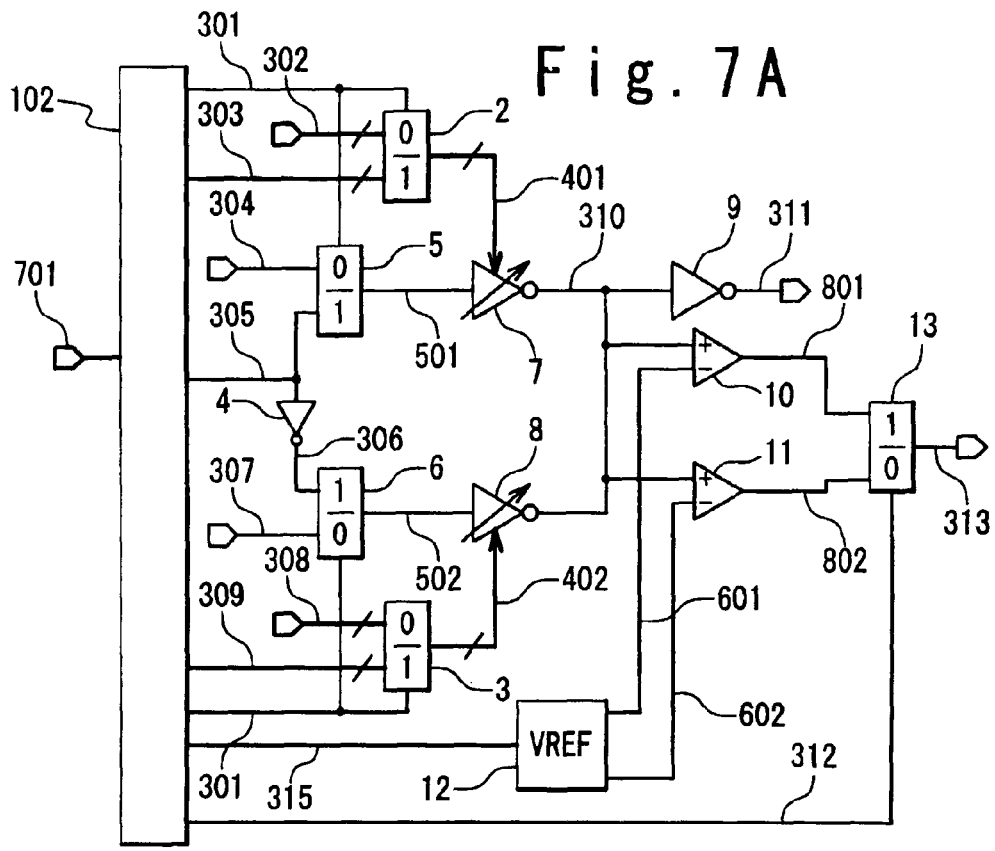
FIG. 7A is a circuit diagram illustrating an exemplary configuration of a built-in test circuit testing variable delay circuits in a third embodiment of the present invention.

FIG. 7A is a circuit diagram showing an exemplary configuration of a test circuit testing variable delay circuits in a third embodiment of the present invention. The circuit configuration of the test circuit of the third embodiment is almost identical to that of the second embodiment. The difference is that the reference voltage generator circuit 12 receives a reference voltage control signal 315 from a test control circuit 102, and generates the reference voltage signals 601 and 602 in response to the reference voltage control signal 315.

Figure 7B:
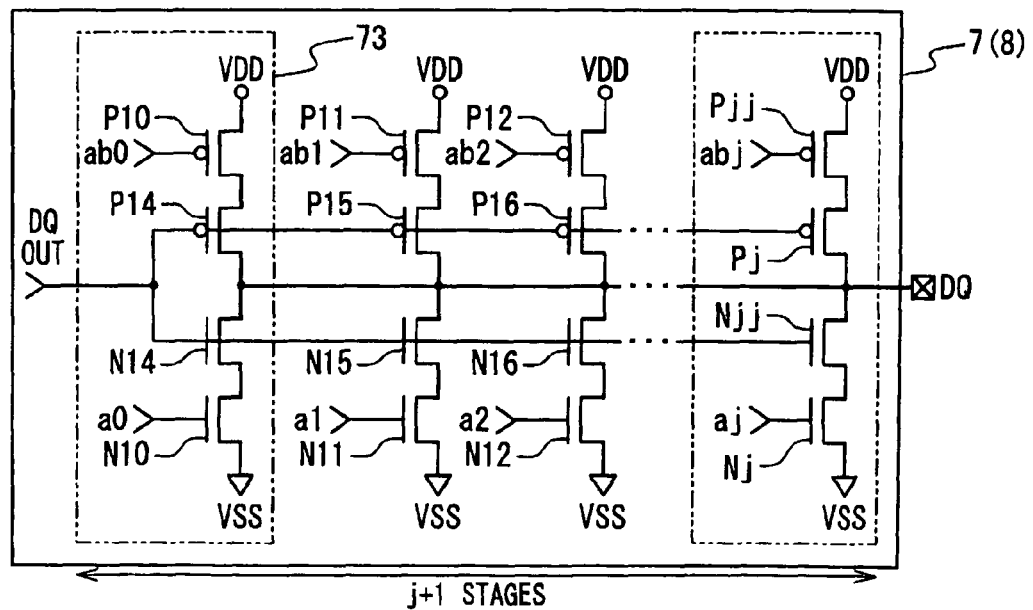
FIG. 7B is a circuit diagram illustrating an exemplary configuration of the variable delay circuits in the third embodiment.

FIG. 7B shows a generalized configuration of the variable delay circuits 7 and 8. In FIG. 7B, the variable delay circuits 7 and 8 are shown as including (j+1) serially-connected inverter circuits 73 each including four transistors, while the variable delay circuit is shown as including four serially-connected inverter circuits in FIG. 1A.

The inverter circuits 73 are individually activated in response to the control signals a0 to aj and ab0 to abj. In the following, the difference between the number of the activated inverter circuits 73 in the variable delay circuit 7 and that in the variable delay circuit 8 is defined as the "activated inverter number difference".

The circuit configuration shown in FIG. 7A allows controlling the voltage levels of the reference voltage signals 601 and 602 generated by the reference voltage generator circuit 12 in response to the reference voltage control signal 315, which is controlled on the test bus signals 701. The voltage levels of the reference voltage signals 601 and 602 can be controlled by using the test bus signals 701. This allows operation settings of the comparators 10 and 11.

Figure 8A:
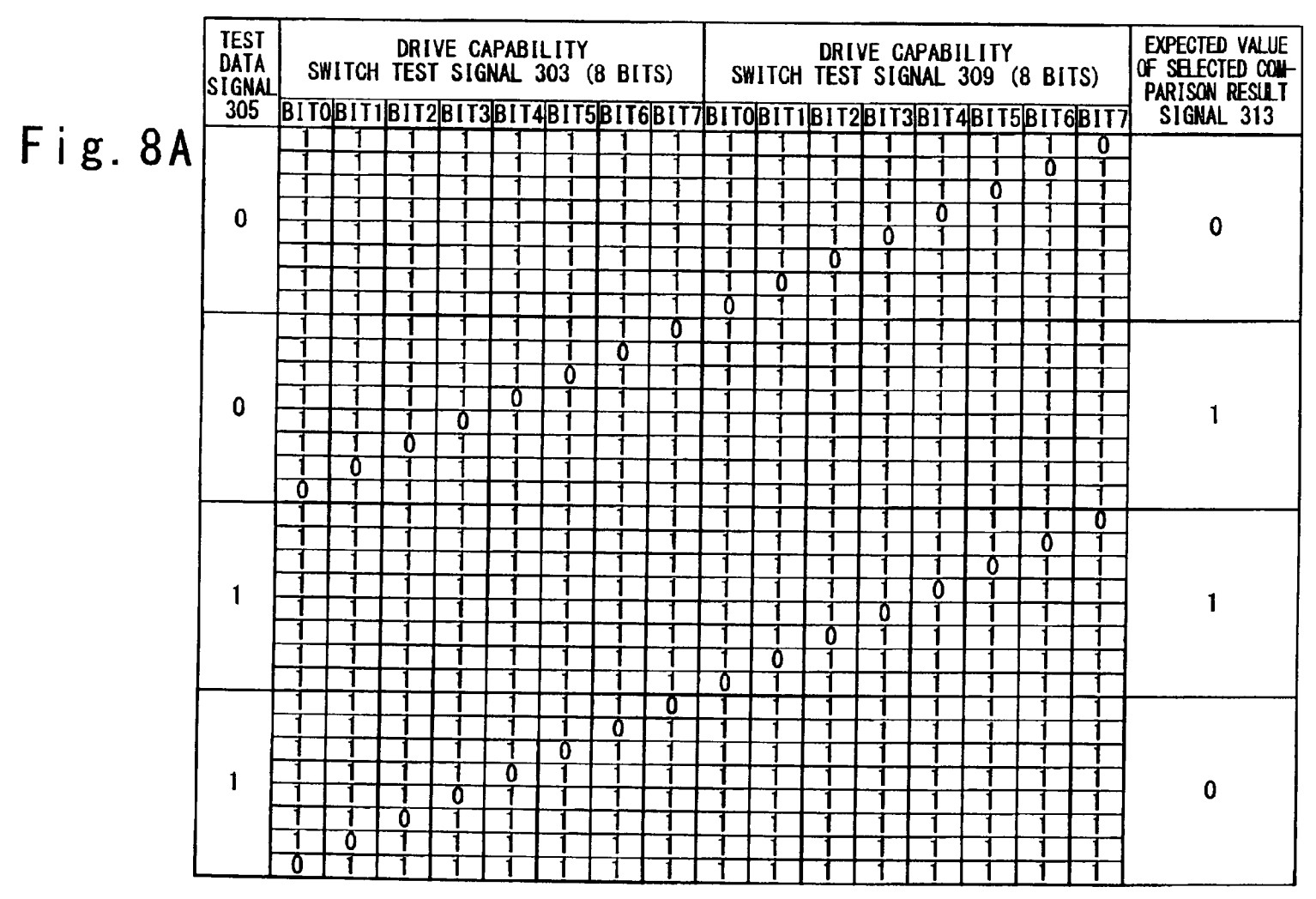

FIGS. 8A and 8B are tables showing exemplary test patterns used in this embodiment. The test patterns are combinations of settings of the test data signal 305, the drive capability switch test signals 303 and 309 and an expected value of the selected comparison result signal 313. The actual value of the selected comparison result signal 313 is compared with the expected value of the selected comparison result signal 313 in each test pattern.

The test patterns shown in FIG. 8A are determined under the condition that the "activated inverter number difference" between the variable delay circuits 7 and 8 is fixed to one. There are 32 possible test patterns which satisfy this condition.

The test patterns shown in FIG. 8B, on the other hand, are determined under the condition that the "activated inverter number difference" between the variable delay circuits 7 and 8 is fixed to two. There are four possible test patterns which satisfy this condition.

As is understood from FIGS. 8A and 8B, the number of test patterns is reduced as the "activated inverter number difference" between the variable delay circuits 7 and 8 is increased. Fixing the "activated inverter number difference" to two allows reducing the number of necessary test patterns to be matched down to four.

The circuit configuration of this embodiment allows controlling the operation settings of the comparators 10 and 11 by using the test bus signals 701, which are used to directly provide test configurations from the external contact pads. This allows reducing the number of necessary test patterns without modifying the configuration of the reference voltage generator circuit 12. For example, the test patterns shown in FIG. 8B can be used in place of the test patterns shown in FIG. 8A. This effectively reduces the test time.

It would be apparent to the person skilled in the art that the use of the test patterns shown in FIG. 8B in place of those shown in FIG. 8A is merely one example. The test patterns can be variously modified with the adjustment of the operation settings of the comparators 10 and 11.

(Fourth Embodiment)

Figure 9:
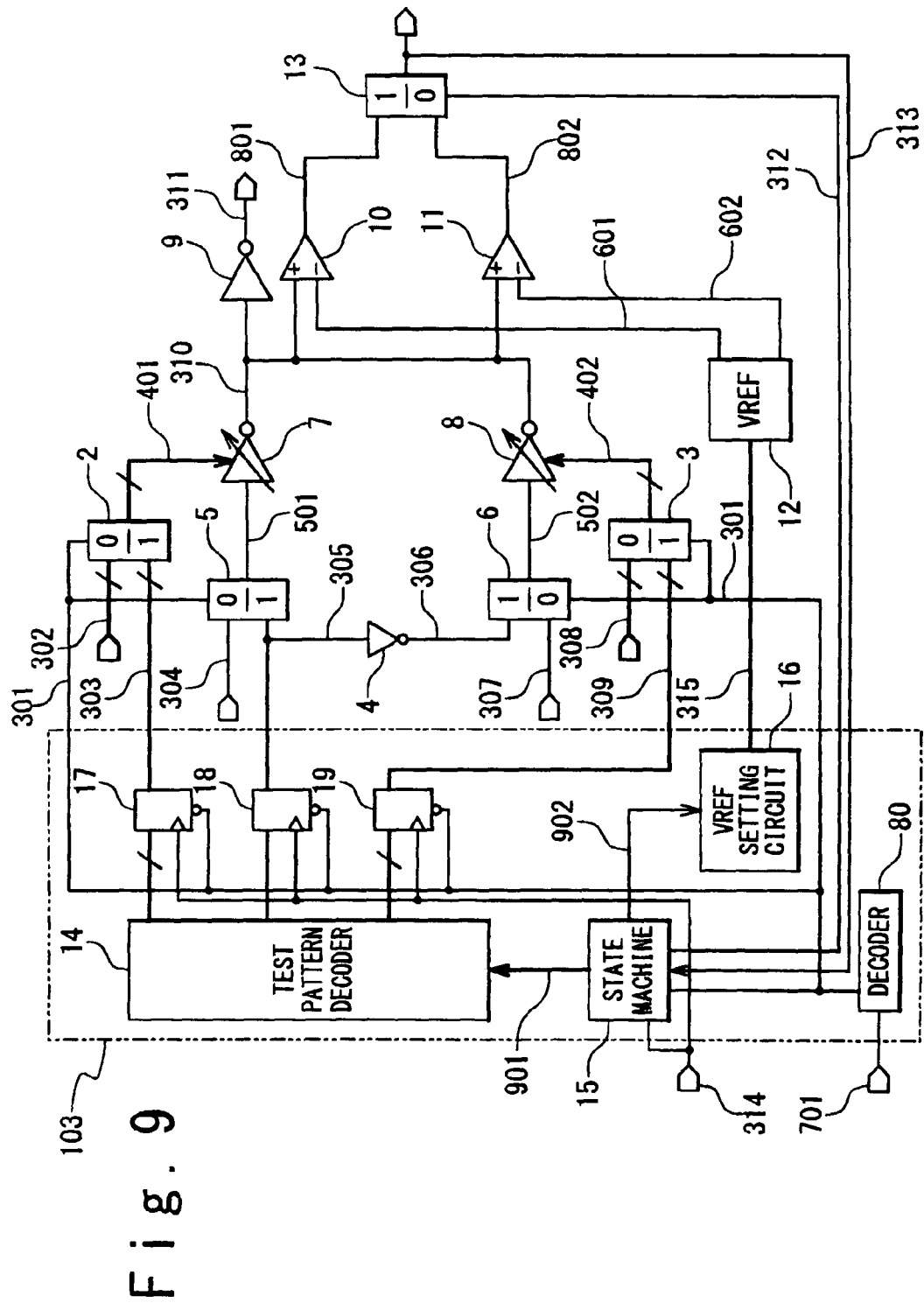
FIG. 9 is a circuit diagram illustrating an exemplary configuration of a built-in test circuit testing variable delay circuits in a fourth embodiment of the present invention.

FIG. 9 is a circuit diagram showing an exemplary configuration of a test circuit testing variable delay circuits in a fourth embodiment of the present invention.

The configuration of the test circuit of this embodiment is almost similar to that shown in FIG. 7A. The difference is that the test control circuit 102 is replaced with a test control circuit 103, and the output signal of the switch 13, that is, the selected comparison result signal 313 is fed back to the test control circuit 103.

In this embodiment, the test control circuit 103 is provided with a test pattern decoder 14, a state machine 14, a reference voltage setting circuit 16, a decoder 80 and three flipflops 17 to 19. The decoder 80 receives the data bus signal 701 and generates the test enable signal 301. The state machine 15 receives the test enable signal 301 and the selected comparison result signal 313, and generates the expected value switch signal 312, a state transition decode signal 901 and a reference voltage state transition decode signal 902 in synchronization with a test clock signal 314. The test pattern decoder 14 generates the test data signal 305 and the drive capability switch test signals 303 and 309.

The flipflops 17 to 19 operate as output stages of the test control circuit 103. The flipflop 17 latches the drive capability switch test signals 303 from the test pattern decoder 14 in synchronization with the test clock signal 314 and forwards the drive capability switch test signals 303 to the switch 2. Correspondingly, the flipflop 19 latches the drive capability switch test signals 309 from the test pattern decoder 14 in synchronization with the test clock signal 314 and forwards the drive capability switch test signals 309 to the switch 3. The flipflop 18 latches the test data signal 305 from the test pattern decoder 14 in synchronization with the test clock signal 314, and forwards the test data signal 305 to the switch 5 and the inverter 4. The flipflops 17 to 19 receives the test enable signal 301 on the reset terminal to be reset in response to the deactivation of the test enable signal 301.

Figure 10:
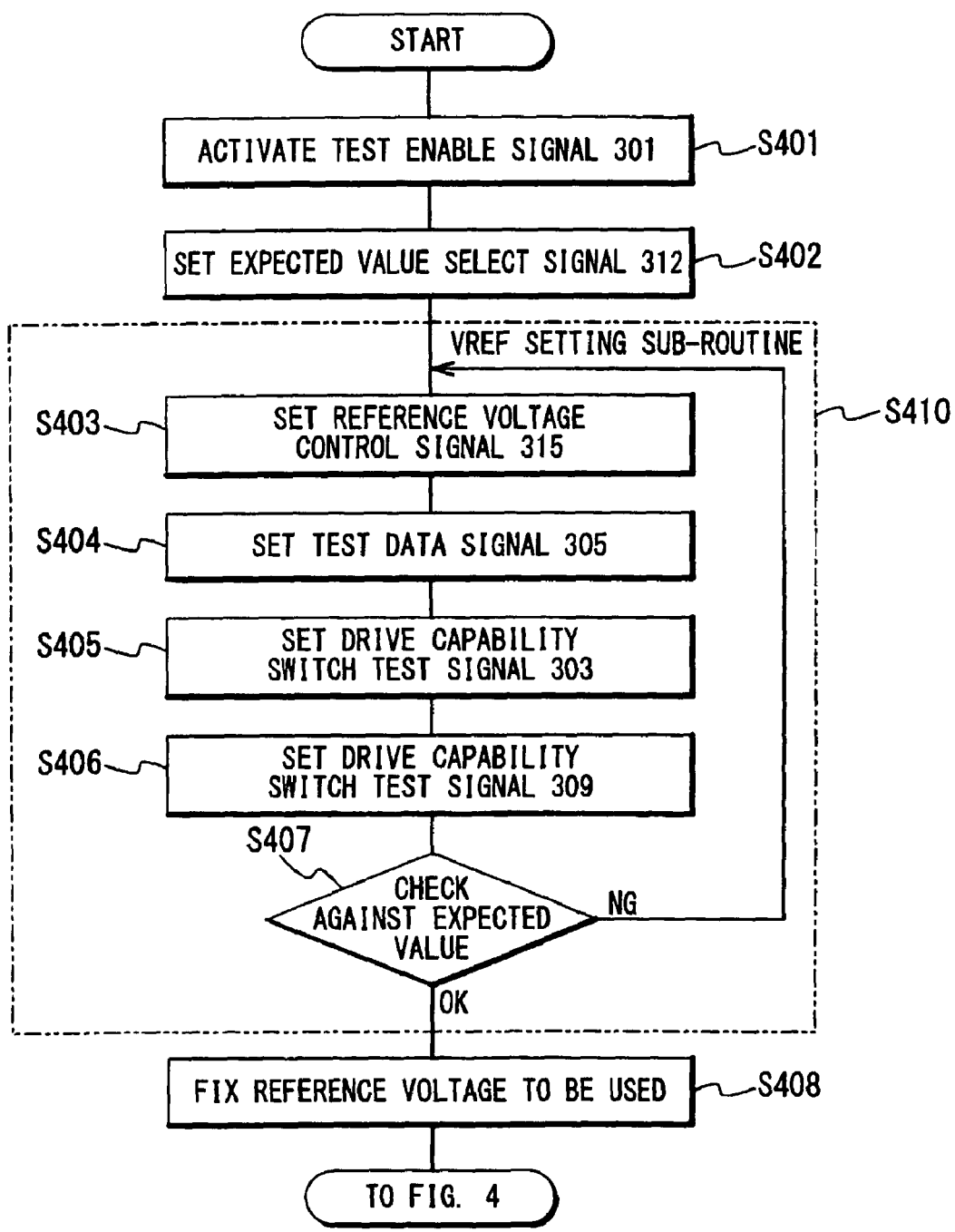
FIG. 10 is a flowchart showing an exemplary procedure of the delay test in the fourth embodiment.

FIG. 10 is a flowchart showing an exemplary procedure of testing the variable delay circuits 7 and 8. It should be noted that the procedure shown in FIG. 4 is performed after the steps shown in FIG. 10 are completed.

The test procedure of this embodiment begins with activation of the test enable signal 301 at Step S401. This is followed by setting the expected value select signal 312 at Step S402.

A reference voltage setting sub-routine is then executed at Step S410. In the reference voltage setting sub-routine, the reference voltage control signal 315 is set at Step S403 so that the high-side reference voltage signal 601 and the low-side reference voltage signal 602 are adjusted to desired voltage levels.

This is followed by setting the test data signal 305 at Step S404, the drive capability switch test signals 303 at Step S405, and the drive capability switch test signals 309 at Step S406.

Subsequently, the actual value of the selected comparison result signal 313 is checked against the expected value which can be determined from the set values of the test data signal 305, the drive capability switch test signals 303, and the drive capability switch test signals 309. When the actual value of the selected comparison result signal 313 does not match the expected value, the procedure returns to Step S403 in the reference voltage sub-routine, and the set value of the reference voltage control signal 315 is modified to change the voltage levels of the high-side reference voltage signal 601 and the low-side reference voltage signal 602. Then, the same procedure is repeated in the reference voltage setting sub-routine until the actual value of the selected comparison result signal 313 matches the expected value.

When the actual value of the selected comparison result signal 313 matches the expected value at Step S407, the set value of the reference voltage control signal 315 is fixed at Step S408. The setting of the voltage levels of the high-side reference voltage signal 601 and the low-side reference voltage signal 602 is completed, and the failure detection procedure shown in FIG. 4 is then performed.

In this embodiment, the selected comparison result signal 313 is fed back to the state machine 15 within the test control circuit 103 to control the reference voltage setting circuit 16 in response to the selected comparison result signal 313. This allows automatically adjusting the voltage levels of the high-side reference voltage signal 601 and the low-side reference voltage signal 602 to optimize the operation settings of the comparators 10 and 11. This effectively reduces the man-hour for adjusting the operations of the comparators 10 and 11.

(Fifth Embodiment)

Figure 11:
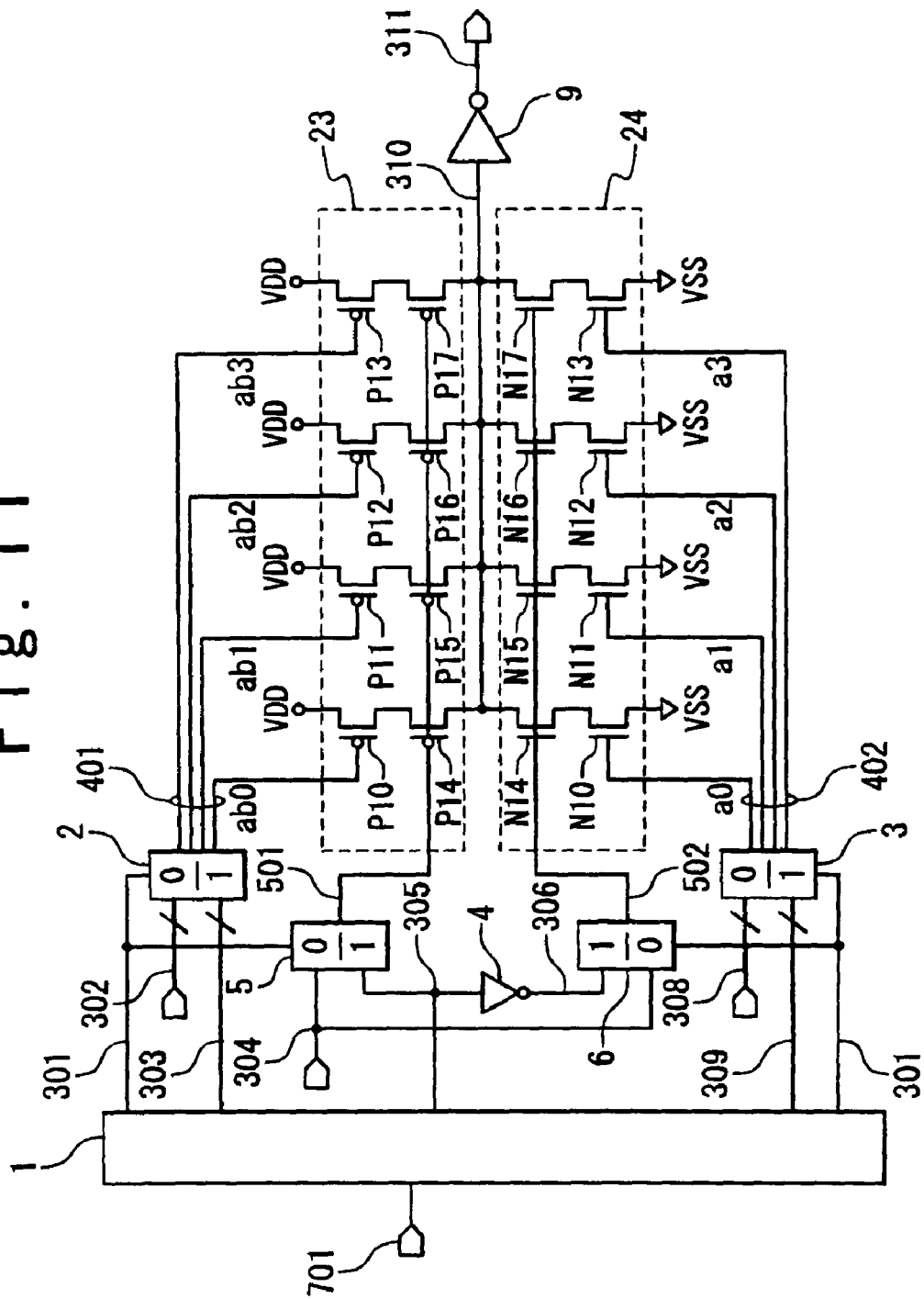
FIG. 11 is a circuit diagram illustrating an exemplary configuration of a built-in test circuit testing variable delay circuits in a fifth embodiment of the present invention.

FIG. 11 is a circuit diagram illustrating a test circuit for testing variable delay circuits in a fifth embodiment of the present invention.

In this embodiment, a pull-up driver 23 and pull-down driver 24 are used as variable delay circuits. The test circuit includes a test control circuit 1, switches 2 and 3, an inverter 4, switches 5, 6 and an output inverter 9.

The test control circuit 1 receives test bus signals 701 and generates a test enable signal 301, a set of drive capability switch test signals 303, a set of drive capability switch test signals 309, and a test data signal 305. The inverter 4 receives the test data signal 305 and generate an inverted test data signal 306.

The switch 2 receives a set of normal operation drive capability control signals 302, the set of the drive capability switch test signals 303 and the test enable signal 301, and selects one of the two sets of the normal operation drive capability control signals 302 and drive capability switch test signals 303 in response to the test enable signal 301. When the test enable signal 301 is deactivated, the switch 2 outputs the normal operation drive capability control signals 302 as drive capability control signals 401. When the test enable signal 301 is activated, on the other hand, the switch 2 outputs the drive capability switch test signals 303 as the drive capability control signals 401. In this embodiment, the drive capability control signals 401 include four control signals ab0 to ab3.

Correspondingly, the switch 3 receives a set of normal operation drive capability control signals 308, the set of the drive capability switch test signals 309 and the test enable signal 301, and selects one of the two sets of the normal operation drive capability control signals 308 and drive capability switch test signals 309 in response to the test enable signal 301. When the test enable signal 301 is deactivated, the switch 3 outputs the normal operation drive capability control signals 303 as drive capability control signals 402. When the test enable signal 301 is activated, on the other hand, the switch 3 outputs the drive capability switch test signals 309 as the drive capability control signals 402. In this embodiment, the drive capability control signals 402 include four control signals a0 to a3.

The switch 5 receives a normal operation data signal 304, the test data signal 305 and the test enable signal 301, and selects one of the normal operation data signal 304 and the test data signal 305 in response to the test enable signal 301. When the test enable signal 301 is deactivated, the switch 5 outputs the normal operation data signal 304 as a selected data signal 501. When the test enable signal 301 is activated, on the other hand, the switch 5 outputs the test data signal 305 as the selected data signal 501.

Correspondingly, the switch 6 receives the normal operation data signal 304, the inverted test data signal 306 and the test enable signal 301, and selects one of the normal operation data signal 304 and the inverted test data signal 306 in response to the test enable signal 301. When the test enable signal 301 is deactivated, the switch 6 outputs the normal operation data signal 304 as a selected data signal 502. When the test enable signal 301 is activated, on the other hand, the switch 6 outputs the inverted test data signal 306 as the selected data signal 502.

The configuration of the pull-up driver 23 is identical to that shown in FIG. 1A. The pull-up driver 23 receives the selected data signal 501 and the drive capability control signals 401, and pulls up a wire-connection line 310 in response to the selected data signal 501. The drive capability of the pull-up driver 23 is controlled on the drive capability control signals 401.

Correspondingly, the configuration of the pull-down driver 24 is identical to that shown in FIG. 1A. The pull-down driver 24 receives the selected data signal 502 and the drive capability control signals 402, and pulls up the wire-connection line 310 in response to the selected data signal 502. The drive capability of the pull-down driver 24 is controlled on the drive capability control signals 402.

The output inverter 9 generates an output signal 311 in response to the voltage level on the wire-connection line 310.

In this embodiment, the pull-up driver 23 is used as the variable delay circuit 7 of the first embodiment, and the pull-down driver 24 is used as the variable delay circuit 8 of the first embodiment, and the test circuit of this embodiment operates in the same way as that of the first embodiment.

The above-presented description is directed to test circuits for testing variable delay circuits in which the delay thereof is adjusted by controlling the drive capability. The outputs of two variable delay circuits are wire-connected. In the test, test data signals of complementary voltage levels are fed to the inputs of the variable delay circuits with the drive capabilities thereof controlled on the drive capability control signals. This allows finding failure of transistors within the variable delay circuits regardless of the test circuit operation margin, even when the allowed delay adjustment amount of the variable delay circuits is extremely reduced.

When the drive capability difference between the two variable delay circuits is very small, the voltage level of the wire-connected line 310 should be determined with high precision. In such a case, the use of multiple comparators allows determining the voltage level of the wire-connected line 310 with high precision and thereby detecting a minute drive capability difference between the two variable delay circuits. This allows testing variable delay circuits adapted to the further high speed operation.

In addition, the configuration in which the operation settings of the comparators are variable by external contact pads as in the third embodiment allows reducing the number of necessary test patterns and the test time.

When the selected comparison result signal is fed back to the reference voltage setting circuit as in the fourth embodiment, the operation settings of the comparators may be automatically optimized before performing the test. This allows reducing the man-hour for optimizing the operation settings of the comparators.

As in the fifth embodiment, a pull-up driver and pull-down driver may be used as the two variable delay circuits.

It is apparent that the present invention is not limited to the above embodiments, but may be modified and changed without departing from the scope of the invention.

What is claimed is:

1. An integrated circuit comprising:
    first and second variable delay circuits;
    a test data feeding circuit that feeds first and second test data signals to said first and second variable delay circuits, respectively, said first and second test data signals being complementary to each other;
    a test control circuit feeding first and second drive capability control signals to said first and second variable delay circuits to control drive capabilities of said first and second variable delay circuits;
    a wire-connection line providing a wire-connection for outputs of said first and second variable delay circuits;
    a reference voltage generator circuit generating first and second reference voltages;
    a first comparator comparing a voltage level on said wire-connection line with said first reference voltage;
    a second comparator comparing the voltage level on said wire-connection line with said second reference voltage; and
    a switch selecting one of output signals of said first and second comparators as a comparison result.

2. The integrated circuit according to claim 1, wherein said test control circuit controls said reference voltage generator circuit.

3. The integrated circuit according to claim 1, wherein said test control circuit includes:
    a reference voltage setting circuit which generates a reference voltage setting signal controlling said reference voltage generator circuit in response to said comparison result outputted from said switch.

4. An integrated circuit comprising:
    first and second variable delay circuits;
    a test data feeding circuit that feeds first and second test data signals to said first and second variable delay circuits, respectively, said first and second test data signals being complementary to each other;
    a test control circuit feeding first and second drive capability control signals to said first and second variable delay circuits to control drive capabilities of said first and second variable delay circuits;
    a wire-connection line providing a wire-connection for outputs of said first and second variable delay circuits;
    a reference voltage generator circuit generating a plurality of reference voltages;
    a plurality of comparators comparing a voltage level on said wire-connection line with said plurality of reference voltages, respectively; and
    a voltage range determining logic circuit determining a voltage range in which the voltage level on said wire-connection line resides, in response to output signals of said plurality of comparators.

5. An integrated circuit comprising:
    first and second variable delay circuits;
    a test data feeding circuit that feeds first and second test data signals to said first and second variable delay circuits, respectively, said first and second test data signals being complementary to each other;
    a test control circuit feeding first and second drive capability control signals to said first and second variable delay circuits to control drive capabilities of said first and second variable delay circuits; and
    a wire-connection line providing a wire-connection for outputs of said first and second variable delay circuits,
    wherein the first variable delay circuit has a first drive capability and the second variable delay circuit has a second drive capability, and an actual voltage level on the wire-connection line depends on whether the first drive capability is higher than the second drive capability.

6. An integrated circuit comprising:
    first and second variable delay circuits;
    a test data feeding circuit that feeds first and second test data signals to said first and second variable delay circuits, respectively, said first and second test data signals being complementary to each other;
    a test control circuit feeding first and second drive capability control signals to said first and second variable delay circuits to control drive capabilities of said first and second variable delay circuits; and
    a wire-connection line providing a wire-connection for outputs of said first and second variable delay circuits, wherein the test control circuit generates a plurality of signals comprising the first and second drive capability control signals and the first test data signal.

7. The integrated circuit according to claim 6, wherein the test data feeding circuit comprises a switch comprising a plurality of inputs including:
   a first input configured to receive a normal operation signal; and
   a second input configured to receive a signal of the plurality of signals generated by the test control circuit.

8. The integrated circuit according to claim 7, wherein the switch further comprises a third input that is configured to receive a test enable signal from the test control circuit,
   wherein, when the test enable signal is activated, the switch outputs the signal received by the second input, otherwise the switch outputs the normal operation signal.

* * * * *